April 17, 1962 R. GITTLEMAN 3,030,022
TRANSISTORIZED AUTOMATIC GAIN CONTROL CIRCUIT
Filed April 16, 1957 2 Sheets-Sheet 1

INVENTOR.
Ralph Gittleman
BY
Moran, Nolte + Nolte
ATTYS

April 17, 1962 R. GITTLEMAN 3,030,022

TRANSISTORIZED AUTOMATIC GAIN CONTROL CIRCUIT

Filed April 16, 1957 2 Sheets-Sheet 2

INVENTOR.
Ralph Gittleman
BY
Moses, Nolte + Nolte
ATT'YS

United States Patent Office 3,030,022

Patented Apr. 17, 1962

3,030,022

TRANSISTORIZED AUTOMATIC GAIN CONTROL CIRCUIT

Ralph Gittleman, Bayside, N.Y., assignor to Maxson Electronics Corporation, a corporation of New York Filed Apr. 16, 1957, Ser. No. 653,195
13 Claims. (Cl. 235—195)

This application is a continuation-in-part application of my application Serial No. 506,114 filed May 5, 1955, now abandoned.

The present invention relates to variable gain amplifiers and particularly to an amplifier capable of providing automatic gain control, multiplication, division or other mathematical operations.

There are many servo applications, such as the mathematical operations of division and composition of vectors, where undesired variations in the gain of the servo system occur. The gain variation in these operations affects the servo accuracy and stability. In some cases, steps must be taken to continuously control the gain of the servo system, and an automatic gain control device is then needed.

According to one particular embodiment of the invention, such an automatic gain control unit is a network having three pairs of terminals, for providing a signal input, a control input, and a signal output. The voltage gain seen by the signal is a desired function of the control voltage, for example inversely proportional to the control voltage, over a specified range of control voltages.

This result is accomplished by a transistorized AGC circuit which utilizes a shunt feedback amplifier with a nonlinear element in the feedback loop to control the gain of the amplifier. The small signal resistance of the nonlinear element is made to vary inversely with control voltage; this variation causes the gain of the feedback amplifier to vary similarly. With the feedback amplifier inserted in the servo error voltage path, the overall sensitivity of the servo can be held constant within ±25 percent over a range of control voltage variations of 100 to 1. This control can be maintained over an ambient temperature range of —55° C. to +85° C. The nonlinear control element used is a silicon junction diode. The small signal resistance of the diode may be varied over a wide range by suitably biasing it with direct current in the forward direction. Analysis shows that for small signals a junction diode may be represented as a resistance inversely proportional to the forward current through it.

In other embodiments of the invention a silicon junction diode is positioned in the amplifier circuit so as to cause it to perform the operations of multiplication and division or automatic gain control.

The principal object of the invention is to provide an amplifier circuit capable of providing automatic gain control, multiplication, or division by utilizing the small signal resistance of a diode, particularly a junction diode.

Another object of the invention is to provide a transistorized automatic gain control circuit.

Still another object of the invention is to provide an amplifier having improved automatic gain control characteristics produced by a shunt feed-back loop containing a silicon junction diode.

Another object of the invention is to provide a transistorized amplifier provided with a feed-back loop having a feed-back factor which is variable in accordance with a control voltage.

Other objects and advantages of the present invention will be apparent from the following description and the drawing in which.

Figure 1:
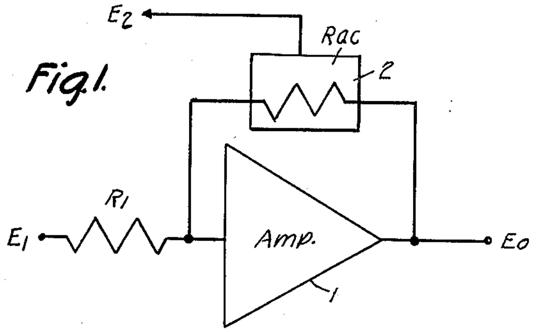
FIG. 1 is a diagram illustrating the principle of the present invention.

Referring to FIG. 1, there is indicated an amplifier 1 which provides an output voltage $E_0$ when an input signal $E_1$ is applied to the amplifier through a resistor $R_1$. Connected in shunt with the amplifier 1 is a control element 2 having a variable resistance $R_{ac}$ to which a control voltage $E_2$ is adapted to be applied. The gain of the amplifier may be varied by varying the alternating current resistance $R_{ac}$ of control element 2 in response to control voltage $E_2$. The variable control element 2 may be a diode, and preferably a silicon junction diode.

Theoretically, the junction diode has almost perfect characteristics for application in a gain control circuit. The small signal resistance of a junction diode biased in the forward direction may be expressed analytically at $$R_{ac}=\frac{KT}{I_{dc}-I_0}$$

where K is a constant dependent upon geometry; T is the absolute temperature in degrees Kelvin; $I_{dc}$ the forward biasing current; and $I_0$ a temperature dependent leakage current. At room temperature (25° C.) KT is approximately .039 and $I_0$ approximately 0.1 microampere in a typical silicon junction diode. As long as $I_{dc}$ is large compared to $I_0$, and the change in diode temperature is small as compared to an absolute temperature of 298° K. (25° C.), then $$R_{ac}=\frac{.039}{I_{dc}}$$

The way in which the small signal resistance of the junction diode is utilized to produce A.G.C., multiplication, or division is the principal feature of the invention. In FIG. 1, the diode resistance $R_{ac}$ is placed in the feedback loop of a high gain amplifier. The transfer ratio or gain $$\frac{E_0}{E_1}$$

of the circuit is then $$\frac{R_{ac}}{R_1}$$

The transfer ratio or gain increases when the feedback decreases, and vice versa, because the feedback is degenerative. By biasing the diode from a current source with a D.C. current proportional to an external control voltage the transfer ratio of the circuit may be accurately controlled. If $R_{ac}$ is made inversely proportional to $E_2$, the external control voltage, the circuit may be used as either an attenuator or a divider to give $$E_0=C_1\frac{E_1}{E_2}$$

where $C_1$ is a constant which may be made equal to 1. If $R_{ac}$ is made proportional to $E_2$, then the circuit is a multiplier giving $E_0=C_2E_1E_2$ where $C_2$ is a constant which may be made equal to 1.

Figure 2:
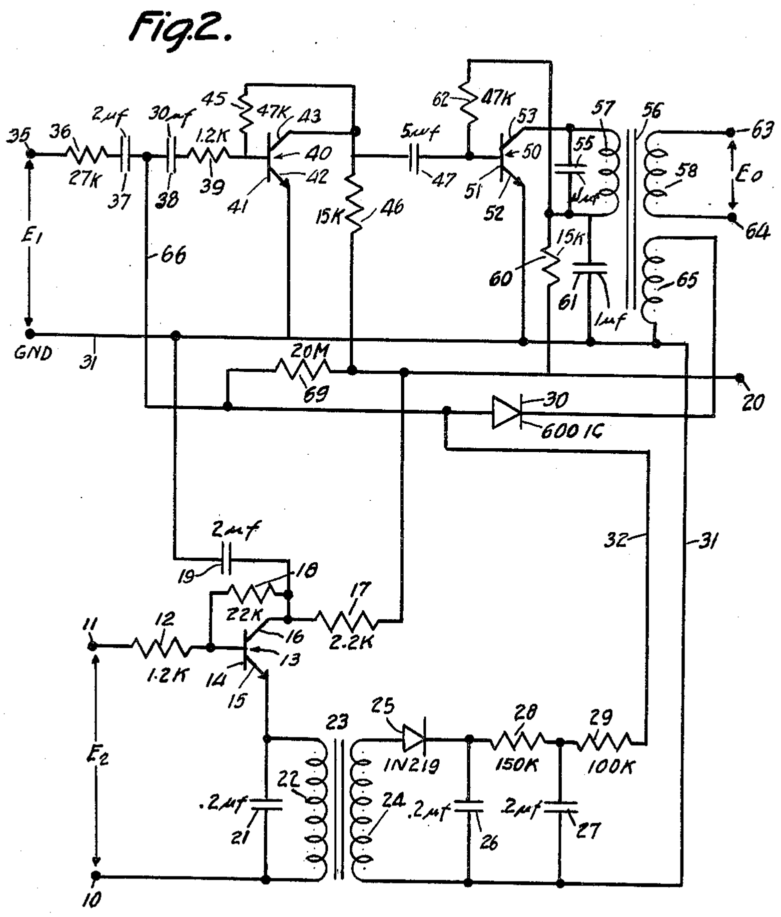
FIG. 2 is a circuit diagram of one embodiment of the present invention.

Referring now to FIG. 2 of the drawing, there is shown a transistorized amplifier embodying the principles illustrated in FIG. 1 of the drawing. A control voltage $E_2$ is applied between the input terminals 10 and 11, the latter of which is connected to the base 14 of the transistor 13 through the resistor 12. The emitter 15 serves as the output electrode, the load for the emitter being formed by a parallel-connected condenser 21 and primary winding 22 of a transformer 23. A D.C. connection to the base electrode is provided by the resistor 18 connected between the base 14 and the collector electrode 16. The collector electrode is also connected by a resistor 17 to a source 20 of collector voltage which may be a 45 volt D.C. supply. The collector 16 is also effectively grounded by a bypass condenser 19 connected between the collector and a ground lead 31. The output of transistor 13 is coupled by the primary winding 22 to the secondary winding 24 of transformer 23 and is thereby impressed on a rectifier diode 25. The output of rectifier 25 is connected to a filter circuit consisting of condensers 26 and 27 and resistors 28, 29. One side of the filter circuit is connected to the ground lead 31 while the other side 32 is connected to a diode 30 which is preferably a silicon junction diode the function of which will be explained more fully hereinafter.

An A.C. input signal $E_1$ is applied between the input terminal 35 and the ground lead 31. The terminal 35 is connected through a resistor 36, bypass condensers 37 and 38, and a resistor 39 to the base 41 of transistor 40. The emitter 42 of this transistor is grounded while the collector 43 is connected through a load resistor 46 to the 45 volt source of collector voltage. A D.C. connection between the collector 43 and the base 41 is provided by a resistor 45. The output of transistor 40 is coupled through a condenser 47 to the base electrode 51 of a second transistor 50. The emitter 52 of the second transistor 50 is grounded, while the collector electrode 53 is connected to an output circuit consisting of a condenser 55 and a primary winding 57 connected in parallel. The other end of the output circuit 55, 57 is bypassed to ground through a condenser 61 and also connected through a resistor 60 to the source of collector voltage. Bias for the base electrode 51 is provided by a connection between the resistor 60 and the base electrode, which connection includes a resistor 62. The primary winding 57 of transformer 56 is coupled to a secondary output winding which provides the output voltage $E_0$ at the terminals 63, 64.

In order to control the gain of the amplifier comprising the transistors 40 and 50, a feedback circuit is provided between the output of the amplifier and the input thereof. This feedback circuit includes a secondary winding 65 coupled to the primary winding 57. One end of the secondary winding is grounded while the other end thereof extends through the diode 30 and conductor 66 to the junction of condensers 37, 38 in the input circuit of the amplifier. The small signal A.C. resistance of the diode 30, is controlled by the current supplied to the diode 30, is controlled by the current supplied to the diode from the rectifier circuit 24, 29. Diode 30 is preferably biased in the forward direction by means of a resistor 69 connected between the D.C. voltage source 20 and one side of the diode 30 for the purpose of compensating for the effect of the temperature dependent leakage current $I_0$. Accordingly, the gain of the amplifier is controlled by the control signal $E_2$ and the sensitivity of the circuit to any change in $I_0$ due to temperature variations, is minimized.

The operation of the circuit shown in FIGS. 1 and 2 will be clear from the foregoing detailed description thereof.

An A.C. control voltage $E_2$ is amplified, rectified, filtered, and applied to the silicon junction diode through resistors 28 and 29 which change the rectified control voltage into a D.C. control current. It is desirable that the diode be biased from a current source so that the equation $$R_{ac}=\frac{KT}{I_{dc}}$$

will be satisfied. $R_{ac}$, the small signal resistance of the diode, is now controlled by the A.C. control voltage $E_2$. Since condensers 26 and 27 are large and the resistances of resistors 28 and 29 are very large compared to the resistance of rectifier 30, rectifier circuit 24—29 is substantially a constant current source. The diode, being a feedback resistor, controls the gain of the A.C. amplifier. The diode is slightly biased in the forward direction to offset the effect of the temperature dependent current $I_0$ and the range of $I_{dc}$ is fixed by the D.C. control circuit so as to minimize the sensitivity of the circuit to any changes in $I_0$ due to temperature variations.

For the sake of definiteness the values of the circuit elements have been indicated in FIG. 2, but it will be understood that the particular values of the circuit elements are not intended to be limitative. Moreover, the circuit may be modified in various ways. For example, in another embodiment of the circuit which has been constructed the amplifier for the input or error, voltage $E_1$ consisted of only one transistor stage and the amplifier for the control voltage $E_2$ consisted of two transistor stages.

It may be noted that amplifier 1 in FIG. 1 is represented in FIG. 2 by the amplifier stages of transistors 40 and 50; unit 2 of FIG. 1 represents diode 30 and the circuit between it and input terminals 10 and 11 for voltage $E_2$, which circuit includes transistor 13 and diode 25; and $R_1$ is represented in FIG. 2 by resistor 36.

Figure 3:
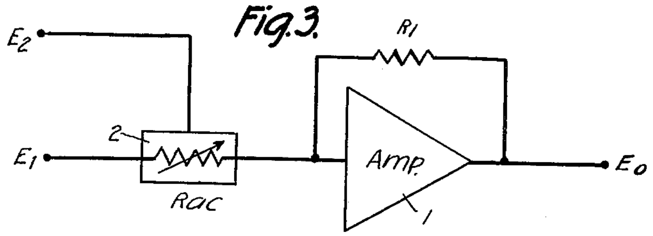
FIGS. 3 to 7 are diagrams of other embodiments of the invention.

FIG. 3 illustrates a circuit in which the positions of resistor $R_1$ and the silicon diode are interchanged. It will be apparent to those skilled in the art that the circuit of FIG. 3 is like that of FIG. 2, except that diode 30, with connections 31 and 32 thereto, is connected in the position of resistor 36 and resistor $R_1$ is put in the place of diode 30. Since the diode resistance, as explained above, is $$R_{ac}=\frac{K}{E_2}$$

and $$E_0=E_1\frac{R_1}{R_{ac}}$$

$E_0=K^1E_1XE_2$, where $K^1$ is a constant. Thus the circuit of FIG. 3 acts as a multiplier.

Figures 4, 5, 6:
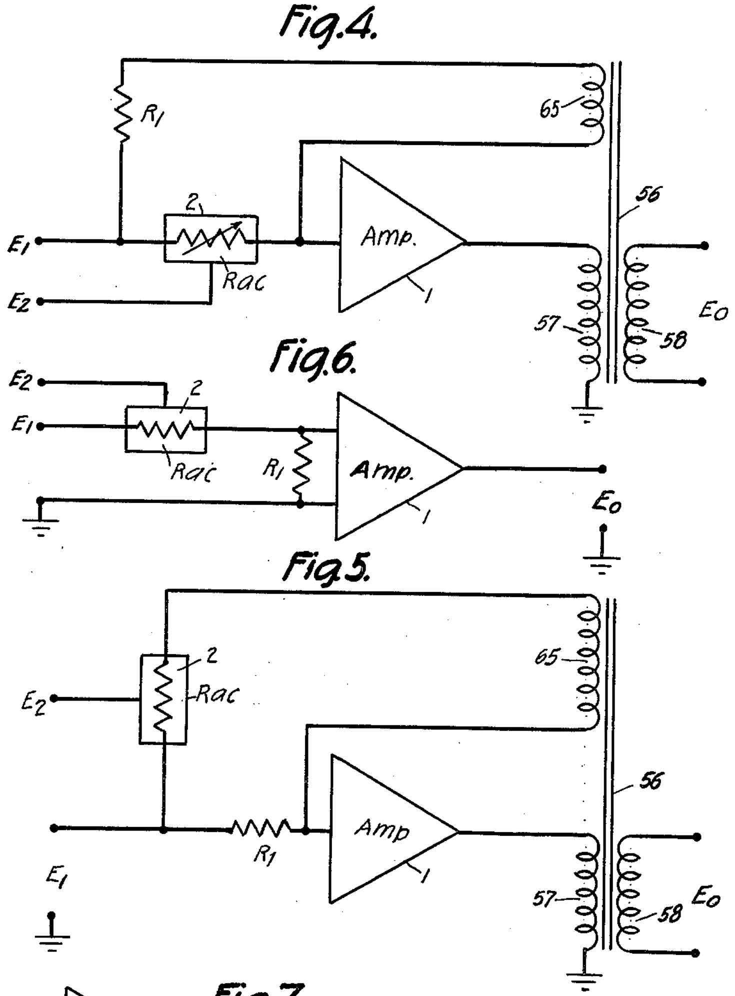

Another useful circuit configuration is that shown in FIG. 4, which differs from FIG. 3 in that the degenerative feedback circuit 65, $R_1$, is connected across the silicon diode $R_{ac}$. For this circuit, $$R_{ac}=\frac{K}{E_2}$$

$$E_0=E_1\frac{R_1+R_{ac}}{R_{ac}}$$

$$R_{ac}\ll R_1,\text{ so that } E_0=E_1\frac{R_1}{R_{ac}}$$

and $E_0=K^1E_1XE_2$. Hence the circuit of FIG. 4 is another multiplier circuit.

The circuit of FIG. 5 differs from that of FIG. 4 in that the positions of $R_1$ and $R_{ac}$ are interchanged. Here $$E_0=E_1\frac{R_{ac}+R_1}{R_1}$$

$$R_1\ll R_{ac}$$

and $$E_0=K^1\frac{E_1}{E_2}$$

so that the circuit divides $E_1$ by $E_2$ and is usable for performing division or for automatic gain control.

In FIG. 6 the input of amplifier 1 is shunted by resistor $R_1$ and the silicon diode $R_{ac}$ is connected in series with the input to the amplifier, from the terminal to which input voltage $E_1$ is applied. In this circuit $$R_{ac}=\frac{K}{E_2}$$

$$E_0=E_1\frac{R_1}{R_{ac}+R_1}$$

$$R_1\ll R_{ac},\text{ so that } E_0=E_1\frac{R_1}{R_{ac}}$$

and $$E_0=K^1E_1\times E_2$$

The circuit of FIG. 6 is therefore a multiplier.

Figure 7:
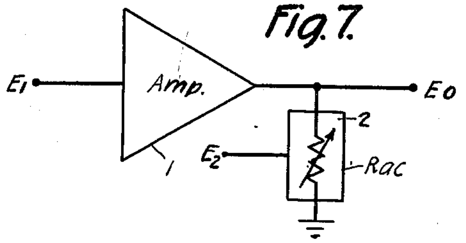

In FIG. 7 the resistance $R_{ac}$ forms the load for amplifier 1. $R_{ac}$ is varied inversely as $E_2$, and $E_0=E_1K_1R_{ac}$, so that $$E_0=K^1\frac{E_1}{E_2}$$

Hence the circuit of FIG. 7 is a dividing circuit.

I have shown and described the particular embodiments of my invention and it will be obvious to those skilled in the art that changes and modifications may be made without departing from my invention and I, therefore, aim in the appended claims, to cover all such changes and modifications as are within the true spirit and scope of my invention.

I claim:

1. A circuit arrangement for producing an amplification gain varying proportionally to the magnitude of an external control voltage comprising a source of input signals, an amplifier having an input electrode, an input circuit, and an output circuit, said input circuit including a resistor having one terminal connected to the source of input signals and its other terminal connected to said input electrode, a signal feedback circuit connected from the output circuit to the junction to the input electrode and said resistor, said feedback circuit including a junction diode connected in series therewith, an external source of control voltage independent of the elements of the circuit arrangement and of said source of input signals and means responsive to said control voltage for supplying a control direct current to said diode for controlling the small signal alternating current resistance of the diode inversely in accordance with said control current and thereby varying the gain of said amplifier in accordance with the control voltage.

2. A circuit arrangement according to claim 1, wherein the diode is a silicon junction diode.

3. A circuit arrangement according to claim 1, wherein said amplifier includes a plurality of transistor amplifier stages connected in cascade.

4. A circuit arrangement according to claim 3, including a further transistor amplifier having an input circuit coupled to said control voltage source, an output circuit coupled to said further transistor amplifier, a rectifier circuit connected to said last mentioned output circuit, said rectifier including a filter circuit having a pair of output conductors connected across said diode.

5. A circuit arrangement according to claim 2, including compensating means for minimizing changes in the gain of said amplifier due to temperature variations of said diode, said compensating means including means for biasing said diode in the forward direction.

6. A circuit arrangement comprising a first amplifier having a plurality of transistors connected in cascade and including an input circuit and an output circuit, a source of signal voltage, a resistor connecting said source to said input circuit, a degenerative feedback circuit connected between the input and output circuits, said feedback circuit including a silicon junction diode, a source of external control voltage independent of said source of signal voltage and the elements of the circuit arrangement, a second transistor amplifier connected to said source of control voltage, rectifying means coupled to said second amplifier for feeding a direct current through said diode in accordance with said control voltage to thereby control the gain of said first amplifier in accordance with said control voltage.

7. The combination of claim 6, in which said feedback circuit is connected across said resistor, the value of the resistor being small relative to the resistance of the diode.

8. A circuit arrangement comprising a transistor amplifier including an input circuit and an output circuit, a source of input signals, a resistor having a resistance equal to $R_1$ connecting said signal source to said input circuit, a degenerative feedback circuit connected between the input and output circuits, said feedback circuit including a silicon junction diode having a resistance $R_{ac}$ to the signals, means including said feedback circuit for varying the gain of the amplifier substantially proportionally to $R_{ac}/R_1$, a source of control voltage external to said circuit arrangement and control means for varying the resistance $R_{ac}$ of the diode in accordance with the control voltage for controlling the gain of said amplifier in accordance with said control voltage.

9. A circuit arrangement according to claim 8, wherein said control means varies the resistance $R_{ac}$ of the diode inversely in accordance with the amplitude of the control voltage.

10. A circuit arrangement according to claim 9, wherein said control means comprises a second transistor amplifier connected to said source of control voltage and rectifying means coupled to said second amplifier for biasing said diode in accordance with said control voltage.

11. In combination, an amplifier, an input circuit for impressing an alternating input voltage having an amplitude $E_1$ on said amplifier, said amplifier including a degenerative resistive feedback circuit, means for controlling the gain of said amplifier in accordance with a control voltage $E_2$, said controlling means including a silicon junction diode in series with the input circuit of said amplifier, said gain controlling means further including means for deriving a direct current in response to said voltage $E_2$ and applying said direct current to said diode to vary the resistance thereof according to said voltage $E_2$ whereby the output voltage $E_0$ of the amplifier is proportional to the product of $E_1$ and $E_2$.

12. The combination described in claim 11, in which the feedback circuit is connected across said diode and the resistance of the diode is small relative to the resistance of the feedback circuit.

13. A circuit arrangement comprising a transistor amplifier including an input circuit and an output circuit, a source of input signals, a resistive element connecting said signal source to said input circuit, a degenerative feedback circuit connected between the input and output circuits and including a resistive element connected in series in the feedback circuit, one of said resistive elements being a silicon junction diode, a source of control voltage and controlling means connected to said voltage source for feeding through said diode a direct current thereby varying the resistance of the diode in accordance with the control voltage for varying the gain of the amplifier in accordance with said control voltage.

References Cited in the file of this patent

UNITED STATES PATENTS

| | | |
|---|---|---|
| 2,290,084 | Albright | July 14, 1942 |
| 2,660,625 | Harrison | Nov. 24, 1953 |
| 2,663,002 | McManis et al. | Dec. 15, 1953 |
| 2,686,296 | Olson et al. | Aug. 10, 1954 |
| 2,714,702 | Shockley | Aug. 2, 1955 |
| 2,722,600 | Forbes et al. | Nov. 1, 1955 |
| 2,772,388 | Erath et al. | Nov. 27, 1956 |
| 2,808,474 | Maynard et al. | Oct. 1, 1957 |

FOREIGN PATENTS

| | | |
|---|---|---|
| 529,044 | Great Britain | Nov. 13, 1940 |
| 611,390 | Great Britain | Oct. 28, 1948 |